(12) United States Patent
Mathew et al.

(10) Patent No.: US 10,325,876 B2
(45) Date of Patent: Jun. 18, 2019

(54) SURFACE FINISH FOR WIREBONDING

(71) Applicants: Varughese Mathew, Austin, TX (US); Burton J. Carpenter, Austin, TX (US); Leo M. Higgins, III, Austin, TX (US); Chu-Chung Lee, Round Rock, TX (US); Tu-Anh N. Tran, Austin, TX (US)

(72) Inventors: Varughese Mathew, Austin, TX (US); Burton J. Carpenter, Austin, TX (US); Leo M. Higgins, III, Austin, TX (US); Chu-Chung Lee, Round Rock, TX (US); Tu-Anh N. Tran, Austin, TX (US)

(73) Assignee: NXP USA, Inc., Austin, TX (US)

(*) Notice: Subject to any disclaimer, the term of this patent is extended or adjusted under 35 U.S.C. 154(b) by 231 days.

(21) Appl. No.: 14/314,260

(22) Filed: Jun. 25, 2014

(65) Prior Publication Data

US 2015/0380376 A1 Dec. 31, 2015

(51) Int. Cl.
*H01L 23/00* (2006.01)
*H01L 23/495* (2006.01)
(Continued)

(52) U.S. Cl.
CPC ........ *H01L 24/49* (2013.01); *H01L 23/49582* (2013.01); *H01L 23/49866* (2013.01);
(Continued)

(58) Field of Classification Search
CPC ........ H01L 24/49; H01L 24/09; H01L 24/17; H01L 24/81; H01L 24/85; H01L 23/49503; H01L 23/49541; H01L 23/49816; H01L 2224/04042; H01L 2224/05082; H01L 2224/05147; H01L 2224/05157; H01L 2224/13147; H01L 2224/16227; H01L 2224/48227; H01L 2224/48247; H01L 2224/48463; H01L 2224/48471;
(Continued)

(56) References Cited

U.S. PATENT DOCUMENTS

| 6,924,232 B2 | 8/2005 | Mathew et al. |
| 7,078,796 B2 | 7/2006 | Dunn et al. |

(Continued)

OTHER PUBLICATIONS

Koo, "Improvement in the Oxidation Resistance of Cu Films by an Electroless Co-Alloy Capping Process", Journal of the Electromechanical Society, 2009, pp. D236-D241.

*Primary Examiner* — Steven H Loke
*Assistant Examiner* — Juanita B Rhodes

(57) ABSTRACT

The present disclosure provides embodiments of package devices and methods for making package devices for a semiconductor die. One embodiment includes a die mounting structure having a finished bond pad that includes a copper bond pad and a cobalt-containing layer over a top surface of the copper bond pad, and a wire bond structure that is bonded to a top surface of the cobalt-containing layer of the finished bond pad, where cobalt-containing material of the cobalt-containing layer is located between a bottom surface of the wire bond structure and the top surface of the copper bond pad such that the cobalt-containing material is present under a center portion of the wire bond structure.

10 Claims, 5 Drawing Sheets

(51) Int. Cl.
  *H01L 23/498* (2006.01)
  *H01L 23/532* (2006.01)
(52) U.S. Cl.
  CPC .............. *H01L 24/05* (2013.01); *H01L 24/45* (2013.01); *H01L 24/48* (2013.01); *H01L 23/49811* (2013.01); *H01L 23/49816* (2013.01); *H01L 23/53238* (2013.01); *H01L 24/29* (2013.01); *H01L 24/32* (2013.01); *H01L 24/73* (2013.01); *H01L 24/85* (2013.01); *H01L 24/92* (2013.01); *H01L 2224/02166* (2013.01); *H01L 2224/04042* (2013.01); *H01L 2224/05082* (2013.01); *H01L 2224/05147* (2013.01); *H01L 2224/05657* (2013.01); *H01L 2224/2919* (2013.01); *H01L 2224/32225* (2013.01); *H01L 2224/32245* (2013.01); *H01L 2224/4554* (2013.01); *H01L 2224/45124* (2013.01); *H01L 2224/45139* (2013.01); *H01L 2224/45144* (2013.01); *H01L 2224/45147* (2013.01); *H01L 2224/45565* (2013.01); *H01L 2224/45624* (2013.01); *H01L 2224/45639* (2013.01); *H01L 2224/45644* (2013.01); *H01L 2224/45655* (2013.01); *H01L 2224/45657* (2013.01); *H01L 2224/45664* (2013.01); *H01L 2224/48091* (2013.01); *H01L 2224/48227* (2013.01); *H01L 2224/48228* (2013.01); *H01L 2224/48247* (2013.01); *H01L 2224/48257* (2013.01); *H01L 2224/48463* (2013.01); *H01L 2224/48465* (2013.01); *H01L 2224/48471* (2013.01); *H01L 2224/48479* (2013.01); *H01L 2224/48482* (2013.01); *H01L 2224/73265* (2013.01); *H01L 2224/83101* (2013.01); *H01L 2224/85051* (2013.01); *H01L 2224/85207* (2013.01); *H01L 2224/85801* (2013.01); *H01L 2224/92247* (2013.01); *H01L 2924/15311* (2013.01); *H01L 2924/15747* (2013.01); *H01L 2924/181* (2013.01)

(58) Field of Classification Search
  CPC . H01L 2224/81801; H01L 2224/85345; H01L 2224/85801; H01L 2924/01005; H01L 2924/01015; H01L 2924/01028; H01L 2924/01042; H01L 2924/01074; H01L 2924/01075; H01L 2924/15311; H01L 23/49582; H01L 2924/181; H01L 2224/48257; H01L 2224/32245; H01L 2224/48465; H01L 2224/32225; H01L 2224/48228; H01L 2224/73265; H01L 23/53238; H01L 2924/00012; H01L 2224/45144; H01L 2924/00014; H01L 2224/45147; H01L 2224/45124; H01L 2224/45139; H01L 2224/05657; H01L 2924/013; H01L 2924/00013; H01L 2224/85207; H01L 2224/2919; H01L 2924/0665; H01L 2224/83101; H01L 2224/92247; H01L 2224/45565; H01L 2224/45657; H01L 2224/45644; H01L 2224/45664; H01L 2224/45624; H01L 2224/45639; H01L 2224/45655; H01L 2924/00; H01L 2224/48091

See application file for complete search history.

(56) References Cited

U.S. PATENT DOCUMENTS

| | | |
|---|---|---|
| 8,043,956 B2 | 10/2011 | Lehr et al. |
| 2005/0001324 A1* | 1/2005 | Dunn .................. G01L 19/0069 257/762 |
| 2005/0098605 A1* | 5/2005 | Edelstein ............. B23K 20/007 228/4.5 |
| 2005/0275100 A1* | 12/2005 | Yakobson ............. H01L 21/288 257/748 |
| 2006/0057839 A1* | 3/2006 | Wang .................. C23C 18/1619 438/629 |
| 2007/0105272 A1* | 5/2007 | Lee |
| 2007/0194424 A1* | 8/2007 | Camacho ................ H01L 25/03 257/686 |
| 2009/0243105 A1* | 10/2009 | Lehr ....................... H01L 24/05 257/751 |
| 2010/0071940 A1* | 3/2010 | Ejiri ....................... H05K 3/244 174/257 |
| 2011/0147072 A1* | 6/2011 | Yamashita ................ C23F 1/02 174/268 |
| 2012/0007239 A1* | 1/2012 | Kolics .................. H01L 23/481 257/E21.59 |

\* cited by examiner

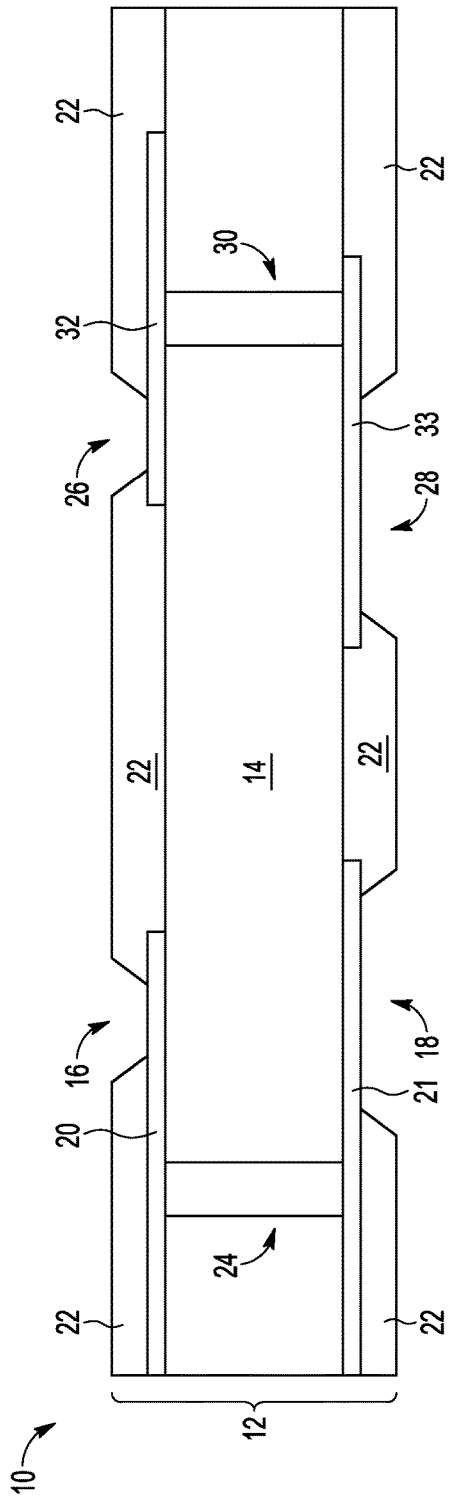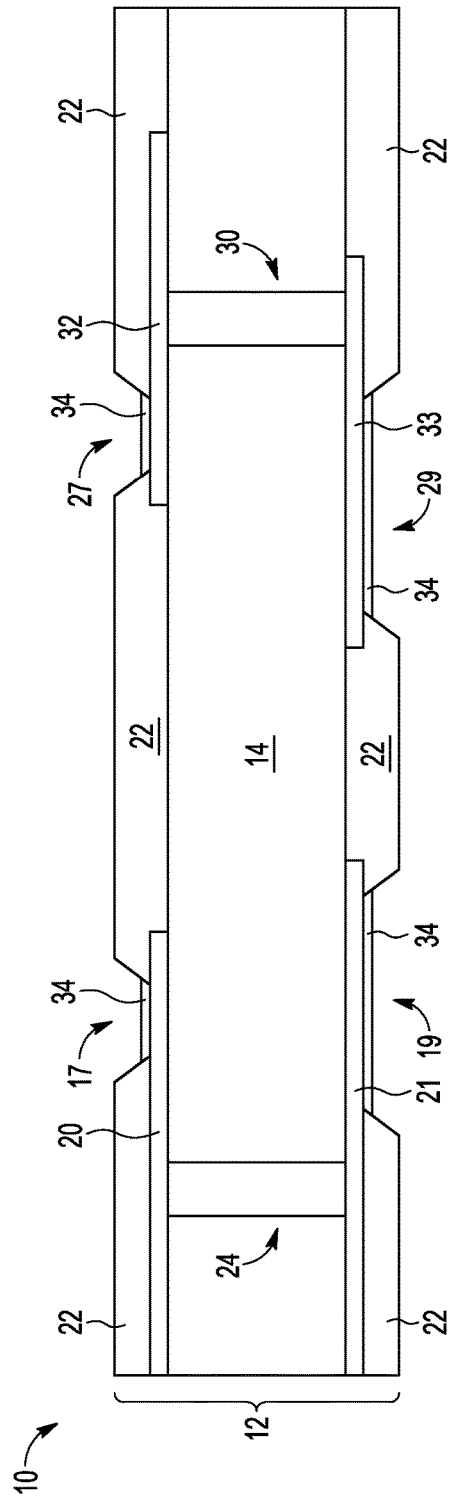
FIG. 1
FIG. 2

SURFACE FINISH FOR WIREBONDING

BACKGROUND

Field

This disclosure relates generally to semiconductors, and more specifically, to finishing a bond pad surface for wirebonding.

Related Art

Semiconductor package devices often include wirebond connections for providing electrical coupling between a package substrate and an encapsulated die. A wirebond connection typically includes a piece of wire that couples a pad on the die to a pad on the package substrate. While the wire and the pads (especially substrate pads) are often made of copper, bare copper pads oxidize over time, making the resulting bonds unreliable.

BRIEF DESCRIPTION OF THE DRAWINGS

The present invention may be better understood, and its numerous objects, features, and advantages made apparent to those skilled in the art by referencing the accompanying drawings.

FIG. 1-5 illustrate cross-sectional side views depicting an example semiconductor package device including a package substrate during successive phases of a fabrication process that implements the present disclosure, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 3:
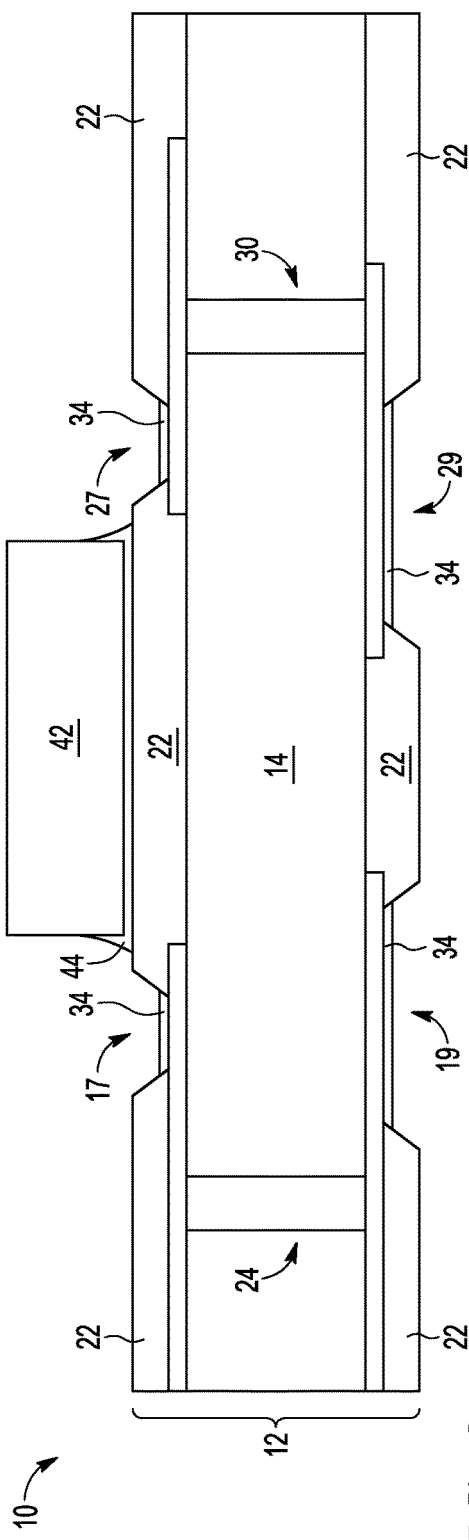

The following sets forth a detailed description of various embodiments intended to be illustrative of the invention and should not be taken to be limiting.

Overview

The formation of copper oxide on a copper pad prevents the ability to reliably make a wirebond connection. While gold can be deposited over a copper pad (typically with an underlayer, such as nickel) to protect it from oxidation, the use of gold presents a significant manufacturing cost for semiconductor package devices. There has been a long-felt need for materials that prevent oxidation of copper pads while keeping manufacturing costs down.

The present disclosure provides embodiments of semiconductor package devices for a semiconductor die, as well as methods for making semiconductor package devices for a semiconductor die. Embodiments of a semiconductor package device include a die mounting structure, such as a package substrate, a lead frame, and the like. The die mounting structure has a finished bond pad that includes a copper bond pad and a cobalt-containing layer over a top surface of the copper bond pad. A wire bond structure is bonded to a top surface of the cobalt-containing layer of the finished bond pad, where the cobalt-containing material of the cobalt-containing layer is located between a bottom surface of the wire bond structure and the top surface of the copper bond pad such that the cobalt-containing material is present under a center portion of the wire bond structure. The cobalt-containing layer protects the copper bond pad from oxidation and improves reliability of a wirebond connection or other electrical connection made to the finished bond pad, while keeping manufacturing costs down.

Example Embodiments

FIG. 1 is a partial cross-sectional view of an example semiconductor package device 10 (or structure 10) that includes a package substrate 12. Package substrate 12 includes a dielectric layer 14, a solder mask 22, conductive traces such as conductive traces 20, 21, 32, and 33, conductive interconnects such as conductive interconnects 24 and 30, and pads such as bond pads 16 and 26 and ball pads 18 and 28. It is noted that a pad is a bonding area in which an electrical connection is made, and includes bond pads (e.g., pads on which wire bonds are bonded), ball pads (e.g., pads on which solder balls are bonded), signal bond pads and down bond pads of a lead frame, bond pads of a semiconductor die, and the like. The conductive traces and conductive interconnects route signals between the bond pads, such as bond pads 16 and 26, through package substrate 12 to a backside of substrate 12 to allow for external electrical connections. For example, signals may be routed to ball bond pads, such as ball pads 18 and 28, which are connected to terminals of a printed circuit board (PCB) or a ball grid array (BGA) by solder ball connections. It is noted that package substrate 12 may include any number of interconnect layers which may include interlayer and intralayer conductive interconnects, in which traces 20, 21, 32, 33 and interconnects 24 and 30 provide representative examples. In the illustrated embodiment, trace 20 is connected to bond pad 16 and interconnect 24, trace 21 is connected to ball pad 18 and interconnect 24, trace 32 is connected to bond pad 26 and interconnect 30, and trace 33 is connected to ball pad 28 and interconnect 30. Solder mask 22 includes openings to expose the pads, such as bond pads 16 and 26 and ball pads 18 and 28. In some embodiments, bond pads 16 and 26 may be on the same side of the package substrate as ball pads 18 and 28. In some embodiments, bond pads 16 and 26 may also be on a same layer as ball pads 18 and 28.

In one embodiment, dielectric layer 14 includes any suitable dielectric material, such as epoxy laminates, ceramics, glass, polytetrafluorethylene, organic based dielectrics (e.g., epoxy, FR-4, FR-5, BT, etc.), polyimide, other plastics, etc. In one embodiment, soldermask 22 includes any suitable insulating material, such as, for example, acrylic-modified epoxy or epoxy. The conductive interconnects may include any conductive material, such as for example, copper, aluminum, tungsten, or molybdenum. The traces, such as traces 20, 21, 32, and 33, include copper, tungsten, or molybdenum. In the illustrated embodiment, pads (such as bond pads 16 and 26 and ball pads 18 and 28) are copper pads. Ambient exposure may cause the copper pads to include copper oxide, which should be removed from the copper pads. For example, the copper pads may be de-greased and cleaned to remove the copper oxide. In some embodiments, an etchant including an acid may be used to perform the clean of the bond pad surface. The etchant may be any suitable etchant, such as, for example, sulfuric acid, hydrochloric acid, peroxide with acid, etc. In some embodiments, rinsing, such as with de-ionized water, is performed after de-greasing and after cleaning. Also, in some alternate embodiments, additional processing steps may be used to prepare the surfaces of the copper pads.

FIG. 2 illustrates processing of semiconductor package device 10 subsequent to FIG. 1 after the copper pads (such as copper bond pads 16 and 26, and copper ball pads 18 and 28) have been prepared, where the prepared copper pad surfaces do not include copper oxide (or at least include a minimum tolerable amount of copper oxide). After a copper pad has been prepared, a finish layer 34 is deposited on the copper pad within the solder mask openings to produce a finished copper pad. In the embodiment illustrated, finish layer 34 is deposited on bond pad 16 to produce finished bond pad 17, finish layer 34 is deposited on bond pad 26 to produce finished bond pad 27, finish layer 34 is deposited on ball pad 18 to produce finished ball pad 19, and finish layer 34 is deposited on ball pad 28 to produce finished ball pad 29. In some embodiments, all of the copper pads on the package substrate are finished with the finish layer 34. In some embodiments, a subset of the package substrate's bond pads, such as bond pads 16 and 26, are finished. In other embodiments, a subset of the package substrate's ball pads, such as ball pads 18 and 28, are finished. In still other embodiments, a subset including a combination of bond pads and ball pads on the package substrate are finished.

Finish layer 34 is an oxidation resistant finish that includes a cobalt-containing material or compound. Some example elements included in a cobalt-containing material include, but are not limited to: cobalt, tungsten, boron, phosphorous, nickel, molybdenum, and rhenium. Some example finishes include, but are not limited to: cobalt (Co), cobalt/boron (CoB), cobalt/tungsten/boron (CoWB), cobalt/phosphorus (CoP), cobalt/tungsten/phosphorus (CoWP), cobalt/rhenium/boron (CoReB), and cobalt/rhenium/phosphorous (CoReP). The preceding list represents element combinations and not necessarily stoichiometric chemical formulas. A finish of cobalt/tungsten/boron (CoWB) also provides an added benefit of being a good diffusion barrier that stops copper from diffusing to the surface of the copper pad. The finish layer minimizes oxidation on the copper pad surface and improves the reliability of wire bonds on the finished copper pad.

Finish layer 34 is deposited up to a thickness of 500 angstroms, such as by electroless plating (e.g., an electroless cobalt bath with aminoborane based reducing agents, such as dimethyl aminoborane and morpholine borane). In another embodiment, finish layer 34 is formed by electrolytic plating. Finish layer 34 is also conductive, resulting in a finished copper pad that is wirebondable (e.g., enables a metallurgical bond to be formed between a wire and the copper pad using adequate heat, pressure, and ultrasonic energy). In some embodiments, it is beneficial to have a finish layer thickness of less than 100 angstroms (and especially beneficial to have a thickness of less than 70 angstroms) in order to break through the finish layer and wirebond directly to the top surface of the copper pad. In other embodiments, it is beneficial to have a finish layer thickness of 300 to 500 angstroms in order to wirebond to the top surface of the finish layer. It is noted that wirebonding to the top surface of the finish layer (rather than breaking through the finish layer and wirebonding directly to the top surface of the copper pad) reduces the risk of exposing the copper pad during the wirebonding process. For example, when breaking through a finish layer to wirebond directly to the surface of the copper pad, a bonding tool (e.g., a capillary or wedge tool) may likely remove or displace the finish layer from the surface of the copper pad, resulting in exposed copper that is likely to oxidize. Wirebonding to the top surface of the finish layer ensures that the finish layer remains over the copper pad and prevents copper exposure that may occur due to the bonding tool scraping off the finish layer. Wirebonding to the top surface of the finish layer also ensures that the cobalt-containing material of the finish layer is in contact with both the wirebond and the copper pad, which assists in forming a robust bond due to inter-diffusion of the copper and cobalt. It is also noted that finish layer 34 is a single layer and does not require an activation layer.

Figure 4:
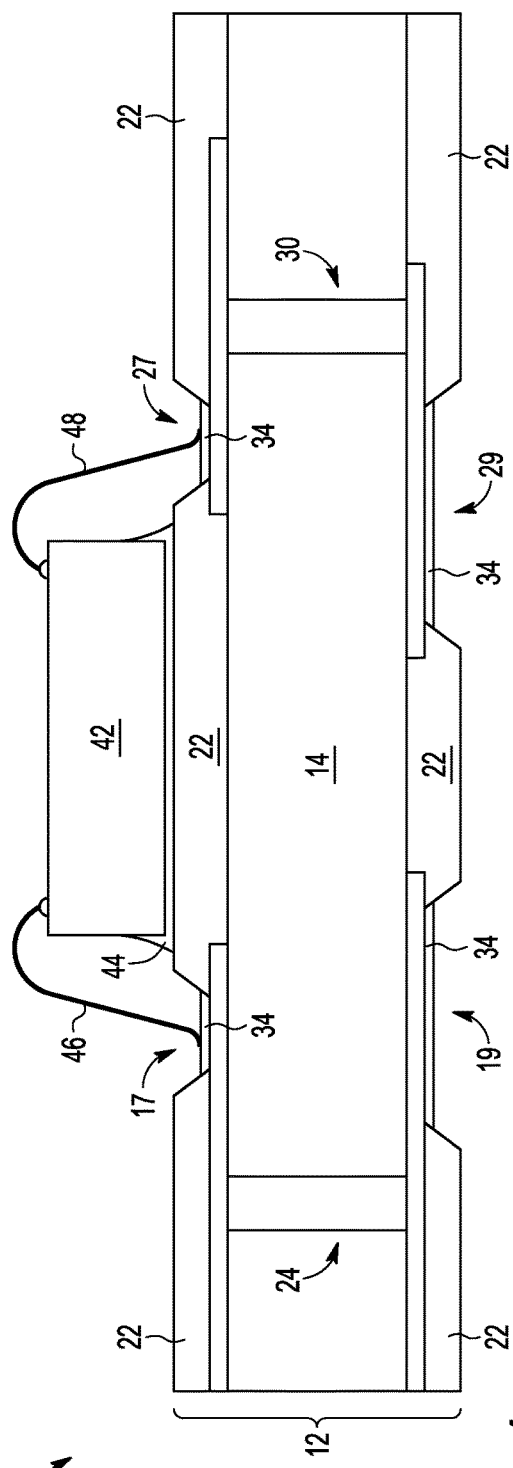

FIG. 3 illustrates processing of semiconductor package device 10 subsequent to FIG. 2. After the copper pads are finished, a semiconductor die 42 is attached to a front side of package substrate 12 (opposite the backside of substrate 12) with a die attach adhesive 44. In some embodiments, semiconductor die 42 may be attached onto the same side of the package substrate as ball pads 18 and 28. Die attach adhesive 44 may also provide thermal and electrical conductivity between the semiconductor die 42 and the package substrate 12. Examples of die attach adhesive 44 include polymer adhesives, epoxies, films, and the like FIG. 4 illustrates processing of semiconductor package device 10 subsequent to FIG. 3. After the die 42 is attached to package substrate 12, wirebond connections are formed between die 42 and the finished copper pads of the package substrate 12. As illustrated, wirebond connection 46 includes a first wire bond formed on a bond pad of die 42, a second wire bond formed on finished bond pad 17 of the package substrate 12, and a wire connecting the first and second wire bonds. Wirebond connection 48 includes a first wire bond formed on another bond pad of die 42, a second wire bond formed on finished bond pad 27 of the package substrate 12, and a wire connecting the first and second wire bonds. In a preferred embodiment, the second wire bonds of the wirebond connections are bonded to a top surface of the finish layer of the finished bond pad. The finish layer minimizes oxidation on the copper pads and improves reliability of the wirebond connections.

The first and second wire bonds of the wirebond connections are formed from wire material of the wire. The wire (and the first and second wire bonds formed from the wire) is a conductive material, such as copper, gold, silver, aluminum, copper coated with a cobalt-containing compound (as noted above), and copper coated with one or more materials such as gold, palladium, aluminum, silver, nickel, and the like. These materials may also be incorporated into the wire by doping. It is noted that some alloying may occur during the wirebonding process, such as the wire material of the wire bond alloying with the cobalt-containing material of the finish layer, the cobalt-containing material alloying with the copper of the copper bond pad, and alloying occurring among the wire material, the cobalt-containing material, and the copper. In some embodiments, the first wire bonds of the wirebond connections are ball bonds and the second wire bonds of the wirebond connections are stitch bonds. In other embodiments, the first wire bonds are stud bumps (or a ball bond with the wire removed) with stitch bonds formed on the stud bumps and the second wire bonds are ball bonds. In still other embodiments, the first and second wire bonds are wedge bonds.

Figure 5:
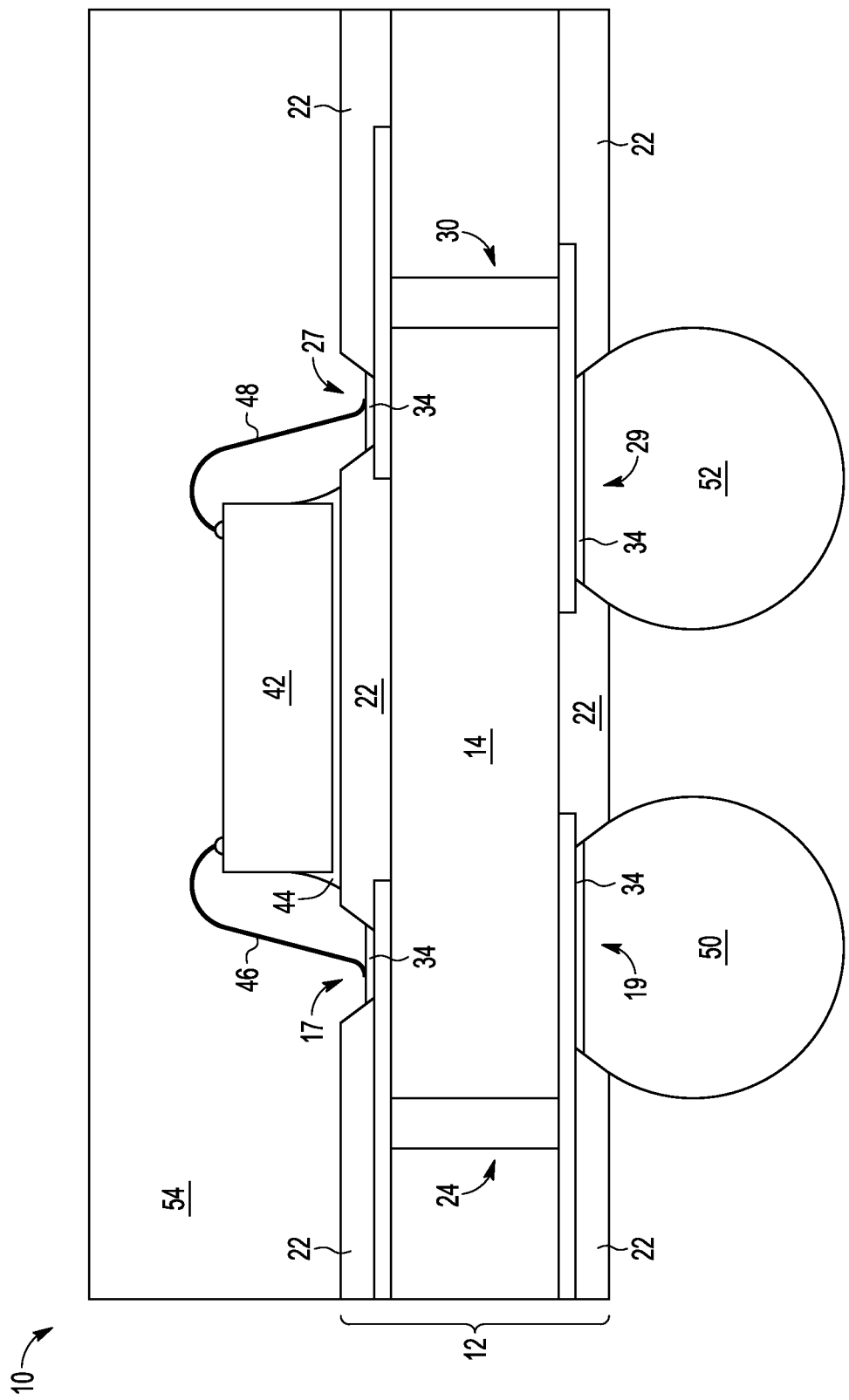

FIG. 5 illustrates processing of semiconductor package device 10 subsequent to FIG. 4. After wirebond connections are made between die 42 and substrate 12, an encapsulant 54 is formed over substrate 12 and encapsulates die 42 and the wirebond connections. Encapsulant 54 may be, for example, a mold compound, epoxy, etc. Additional processing may subsequently be performed, such as, for example, forming solder balls 50 and 52 on the backside of package substrate 12 to allow for external connections, such as to, for example, a PCB, a BGA, or an interposer substrate. In the embodiment illustrated, solder ball 50 is bonded to finished ball pad 19 and solder ball 52 is bonded to finished ball pad 29. The finish layer minimizes oxidation on pads 19 and 29 and improves reliability of the solder balls connections, such as solder balls 50 and 52.

Figure 6:
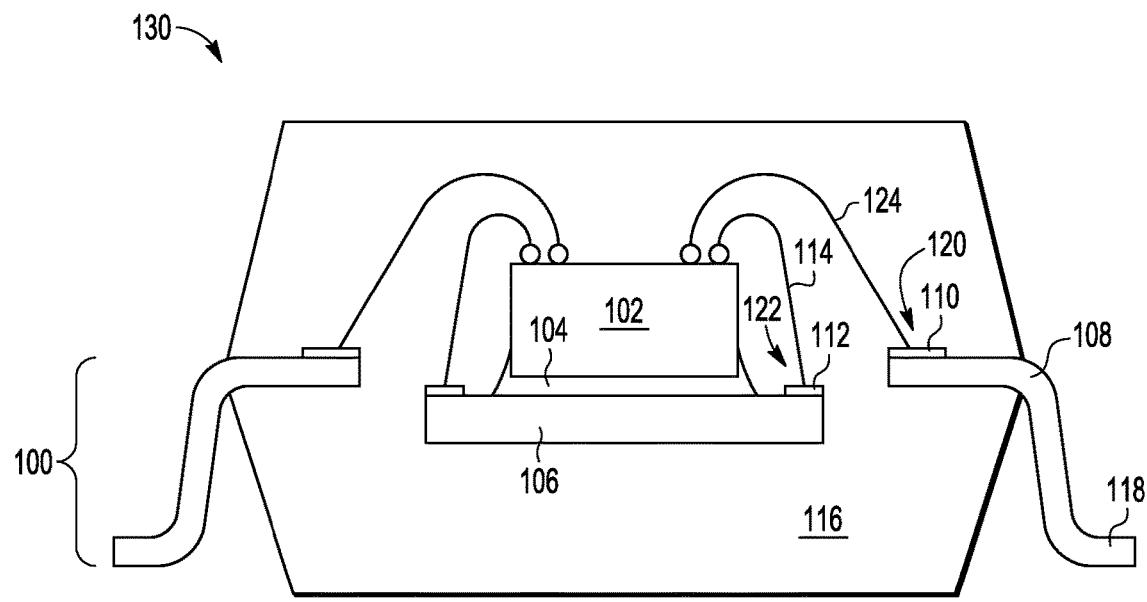
FIG. 6 illustrates a cross-sectional side view depicting an example semiconductor package device including a lead frame in which the present disclosure is implemented, according to some embodiments.

FIG. 6 illustrates a partial cross-sectional view depicting an example semiconductor package device 130 including a lead frame 100 in which the present disclosure is implemented. Lead frame 100 includes a flag region 106 that mounts a semiconductor die 102, which is attached to flag region 106 by die attach adhesive 104. Lead frame 100 also includes a number of leads 108 that each forms an external connection 118. Lead frame 100 can be a copper lead frame, a copper alloy lead frame containing nickel, iron, or other elements, or a non-copper alloy such as a nickel-iron alloy (e.g., NILO® Alloy 42 provided by Special Metals Corp. of Huntington, W. Va.). A finish layer 110 is deposited on a signal bond pad of lead 108 (e.g., plated over an area containing copper in which an electrical connection is made on lead 108) to form a finished signal bond pad 120, and a finish layer 112 is deposited on a down bond pad on the flag region 106 (e.g., plated over an area containing copper in which an electrical connection is made on flag region 106) to form a finished down bond pad 122.

After the die 102 is attached to lead frame 100, wirebond connections are formed between die 102 and the finished pads of the lead frame 100. As illustrated, wirebond connection 114 includes a first wire bond formed on a bond pad of die 102, a second wire bond formed on finished down bond pad 122 of the lead frame 100, and a wire connecting the first and second wire bonds. Wirebond connection 124 includes a first wire bond formed on another bond pad of die 102, a second wire bond formed on finished signal bond pad 120, and a wire connecting the first and second wire bonds. In some embodiments, a wirebond connection (not shown) includes a first wire bond formed on finished down bond pad 122 of the lead frame 100, a second wire bond formed on finished signal bond pad 120, and a wire connecting the first and second wire bonds. The first and second wire bonds are formed from wire material of the wire, which is a conductive material, as discussed above. In some embodiments, the first wire bonds are ball bonds and the second wire bonds are stitch bonds. In other embodiments, the first wire bonds are stud bumps with stitch bonds formed on the stud bumps and the second wire bonds are ball bonds. In still other embodiments, the first and second wire bonds are wedge bonds.

In some embodiments, all of the copper pads on the lead frame are finished with the finish layer 110. In some embodiments, a subset of the lead frame's pads, such as a set of signal bond pads or a set of down bond pads, are finished. In still other embodiments, a subset including a combination of signal bond pads and down bond pads on the lead frame are finished. In still other embodiments, the entire lead frame 100 is finished with the finish layer 110. After the wirebond connections are formed, the die 102 and wirebond connections are encapsulated in an encapsulant 116, which can be a mold compound, epoxy, etc. The finish layer minimizes oxidation on pads 120 and 122 and improves reliability of the wirebond connections, such as wirebond connections 114 and 124.

Figure 7:
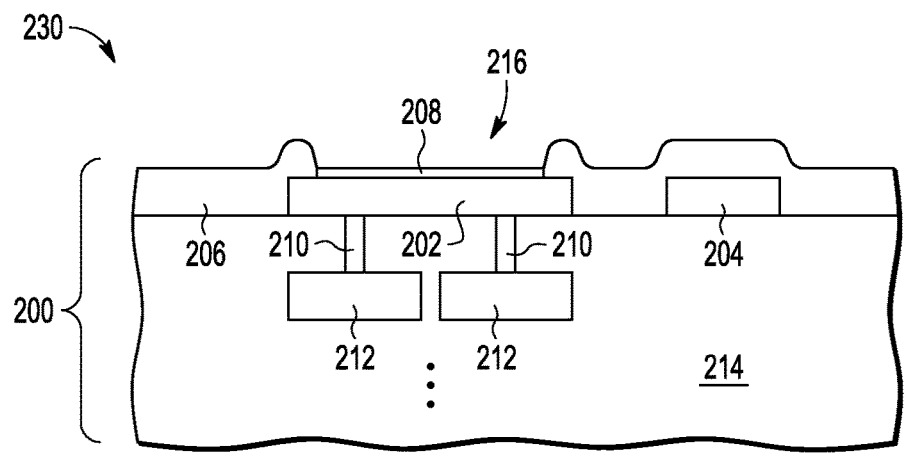
FIG. 7 illustrates a cross-sectional side view depicting an example semiconductor package device including a semiconductor substrate in which the present disclosure is implemented, according to some embodiments.

FIG. 7 illustrates a partial cross-sectional view depicting an example semiconductor package device 230 including a semiconductor substrate 200 in which the present disclosure is implemented. In some embodiments, the semiconductor die 42 of FIG. 5 includes semiconductor substrate 200. In some embodiments, the semiconductor die 102 of FIG. 6 includes semiconductor substrate 200. The semiconductor substrate described herein can be any semiconductor material or combinations of materials, such as gallium arsenide, silicon germanium, silicon-on-insulator (SOI), silicon, monocrystalline silicon, the like, and combinations of the above.

Semiconductor substrate 200 includes copper bond pads, such as bond pad 202, a dielectric material 214, conductive interconnects, such as conductive interconnects 210, and internal connections, such as internal connections 212, within the dielectric material 214, and a passivation layer 206. Other copper 204 may be covered by the passivation layer 206. A finish layer 208 is deposited on bond pad 202, such as by electroless plating, to produce a finished bond pad 216. Accordingly, a wirebond connection can be made from a finished die bond pad to a finished package substrate pad, which improves the reliability of the wirebond connection. The finish layer minimizes oxidation on pad 202 and improves reliability of the wirebond connections.

Figure 8:
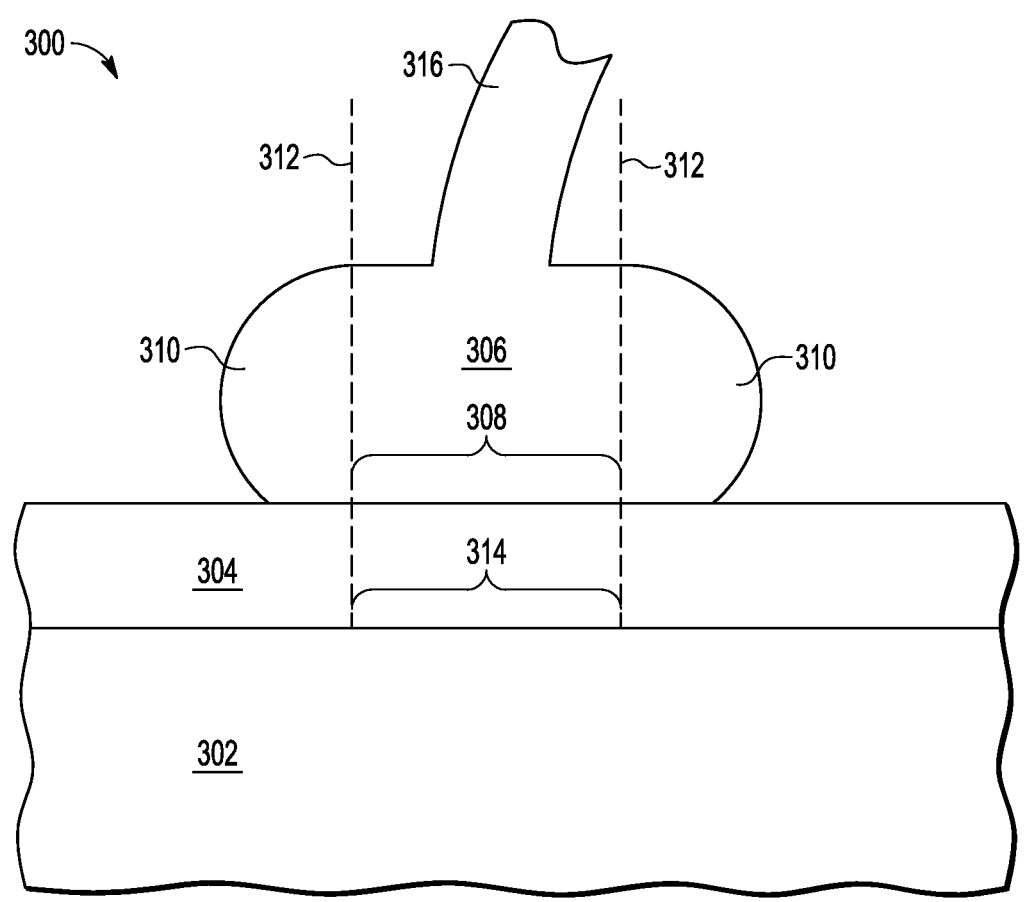
FIG. 8 illustrates a cross-sectional side view depicting an example finished bond pad in which the present disclosure is implemented, according to some embodiments.

FIG. 8 illustrates a partial cross-sectional view depicting an example finished bond pad 300 in which the present disclosure is implemented. In some embodiments, the finished bond pads 17 and 27 on a package substrate include finished bond pad 300. In some embodiments, finished ball pads 19 and 29 of FIG. 5 on a package substrate include finished bond pad 300 (which may also be referred to as a finished ball pad 300). In some embodiments, finished bond pads 120 and 122 of FIG. 6 on a lead frame include finished bond pad 300. In some embodiments, finished bond pad 216 of FIG. 7 on a semiconductor die includes finished bond pad 300. Finished bond pad 300 includes a copper bond pad 302 and a finish layer 304 of a cobalt-containing material over the top surface of the copper bond pad 302. A wire bond structure 306 is bonded to a top surface of finish layer 304. Some examples of wire bond structure 306 include a ball bond, a stitch bond, a wedge bond, a stud bump, a stud bump and a stitch bond, and the like. Wire bond structure 306 is formed from wire material of wire 316, where the wire bond structure 306 and wire 316 are part of a wirebond connection.

Wire bond structure 306 includes a center portion 308 and a surrounding edge portion 310. The center portion 308 is centrally located within the wire bond structure 306. The center portion 308 is delineated from the edge portion 310 by a perimeter 312. In some embodiments, the center portion 308 aligns with the hole diameter of the capillary tool used to form the wire bond structure 306. In some embodiments, at least fifty percent (50%) of the wire bond structure is located within perimeter 312. In some embodiments, at least seventy-five percent (75%) of the wire bond structure is located within perimeter 312. In some embodiments, at least ninety percent (90%) of the wire bond structure is located within perimeter 312. While some alloying may occur during the wirebonding process, a portion 314 of the cobalt-containing material of the finish layer 304 remains under the wire bond structure 306, where the portion 314 is located under the center portion 308 of the wire bond structure 306 between a bottom surface of the wire bond structure 306 and the top surface of the copper bond pad 302. As discussed above, bonding to the top surface of finish layer 304 minimizes exposure of the copper bond pad 302 due to the bonding tool scraping the finish layer 304 off of the copper bond pad 302, resulting in a reliable bond.

By now it should be appreciated that there has been provided a method for finishing copper pad surfaces with an oxidizing reducing layer which contains a cobalt-containing material in order to improve reliability of wirebond connections and other electrical connections made to the finished copper pad surface. In one embodiment of the present disclosure, a package device for a semiconductor die is provided, which includes a package substrate having a finished bond pad that includes a copper bond pad and a cobalt-containing layer over a top surface of the copper bond pad. The package device also has a wire bond structure bonded to a top surface of the cobalt-containing layer of the finished bond pad, where cobalt-containing material of the cobalt-containing layer is located between a bottom surface of the wire bond structure and the top surface of the copper bond pad such that the cobalt-containing material is present under a center portion of the wire bond structure.

One aspect of the above embodiment provides that the package device further includes a finished ball pad on the package substrate, the finished ball pad including a copper ball pad and the cobalt-containing layer over a top surface of the copper ball pad. The package device also includes a solder ball bonded to a top surface of the cobalt-containing layer of the finished ball pad for a ball grid array (BGA) connection. Another further aspect provides that the package substrate includes at least one of a ceramic substrate, an organic substrate, an epoxy substrate, an FR-4 substrate, an FR-5 substrate, a BT substrate, and polyimide substrate.

Another aspect of the above embodiment provides that the wire bond structure includes at least one of a stitch bond, a wedge bond, and a ball bond. Another aspect provides that the wire bond structure is part of a wirebond connection between the finished bond pad on the package substrate and the semiconductor die. The wirebond connection also includes a second wire bond structure that is bonded to a second finished bond pad on the semiconductor die.

Another embodiment of the present disclosure provides for a package device for a semiconductor die including a lead frame. The lead frame has a finished bond pad that includes a copper bond pad and a cobalt-containing layer over a top surface of the copper bond pad. The package device also includes a wire bond structure bonded to a top surface of the cobalt-containing layer of the finished bond pad, where cobalt-containing material of the cobalt-containing layer is located between a bottom surface of the wire bond structure and the top surface of the copper bond pad such that the cobalt-containing material is present under a center portion of the wire bond structure.

Another aspect of the above embodiment provides that the finished bond pad is located on a lead of the lead frame. Another aspect provides that the finished bond pad is located on a flag region of the lead frame. Another aspect provides that the lead frame includes at least one of a copper lead frame, a copper alloy lead frame, and a non-copper alloy lead frame. Another aspect of the above embodiment provides that the wire bond structure includes at least one of a stitch bond, a wedge bond, and a ball bond. Another aspect provides that the wire bond structure is part of a wirebond connection between the finished bond pad on the lead frame and the semiconductor die, where the wirebond connection includes a second wire bond structure that is bonded to a second finished bond pad on the semiconductor die.

Another embodiment of the present disclosure provides for a method of making a package device for a semiconductor die. The method embodiment includes obtaining a die mounting structure having a finished bond pad. The finished bond pad includes a copper bond pad and a cobalt-containing layer over a top surface of the copper bond pad. The method embodiment also includes bonding a wire to a top surface of the cobalt-containing layer of the finished bond pad to form a wire bond structure, where cobalt-containing material of the cobalt-containing layer is located between a bottom surface of the wire bond structure and the top surface of the copper bond pad such that the cobalt-containing material is present under a center portion of the wire bond structure.

One aspect of the above embodiment provides that the wire bond structure includes at least one of a stitch bond, a wedge bond, and a ball bond. Another aspect provides that the wire bond structure is part of a wirebond connection between the finished bond pad on the die mounting structure and the semiconductor die, where the wirebond connection includes a second wire bond structure that is bonded to a second finished bond pad on the semiconductor die. Another aspect provides that the cobalt-containing material includes at least one element of a group of cobalt, tungsten, boron, phosphorous, nickel, molybdenum, and rhenium.

Another aspect provides that the method embodiment further includes attaching the semiconductor die to the die mounting structure prior to the bonding the wire to the top surface of the cobalt-containing layer. Another aspect provides that the obtaining the die mounting structure further includes preparing the die mounting structure, which further includes selectively depositing the cobalt-containing layer on the top surface of the copper bond pad to result in the finished bond pad.

Another aspect provides that the die mounting structure includes a package substrate and that the method embodiment further includes bonding a solder ball to a finished ball pad on the die mounting structure for a ball grid array (BGA) connection, where the finished ball pad includes a copper ball pad and the cobalt-containing layer over a top surface of the copper ball pad. Another aspect provides that the die mounting structure includes a lead frame, where the finished bond pad is located on at least one of a lead of the lead frame and a flag region of the lead frame. Another aspect provides that at least 50% of the wire bond structure is included within a perimeter of the center portion of the wire bond structure.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A package device for a semiconductor die comprising:
    a package substrate having a first finished bond pad that comprises a copper bond pad and a cobalt-containing layer over and directly contacting a top surface of the copper bond pad; and
    a first wire bond structure bonded to and directly contacting a top surface of the cobalt-containing layer of the first finished bond pad, wherein
        cobalt-containing material of the cobalt-containing layer is located between a bottom surface of the first wire bond structure and the top surface of the copper bond pad such that the cobalt-containing material is present under a center portion of the first wire bond structure.

2. The package device of claim 1, further comprising:
    a finished ball pad on the package substrate, the finished ball pad comprising a copper ball pad and the cobalt-containing layer over a top surface of the copper ball pad; and
    a solder ball bonded to a top surface of the cobalt-containing layer of the finished ball pad for a ball grid array (BGA) connection.

3. The package device of claim 1, wherein the package substrate comprises at least one of a ceramic substrate, an organic substrate, an epoxy substrate, and a polyimide substrate.

4. The package device of claim 1, wherein the first wire bond structure comprises at least one of a stitch bond, a wedge bond, and a ball bond.

5. The package device of claim 1, wherein the first wire bond structure is part of a wirebond connection between the first finished bond pad on the package substrate and the semiconductor die, and wherein the wirebond connection further comprises a second wire bond structure that is bonded to a second finished bond pad on the semiconductor die.

6. The package device of claim 1, wherein the cobalt-containing material comprises at least one element of a group of: cobalt, tungsten, boron, phosphorous, nickel, molybdenum, and rhenium.

7. The package device of claim 1, wherein the cobalt-containing material minimizes oxidation on the copper bond pad.

8. The package device of claim 1, further comprising:
    a wirebond connection that includes the first wire bond structure, the wirebond connection comprising copper coated with the cobalt-containing material.

9. The package device of claim 1, further comprising:
    encapsulant material that encapsulates the first finished bond pad and the first wire bond structure.

10. The package device of claim 5, further comprising:
    encapsulant material that encapsulates the first finished bond pad, the first wire bond structure, the second wire bond structure, and the second finished bond pad.

* * * * *